United States Patent
Dawson

(10) Patent No.: US 11,283,973 B2
(45) Date of Patent: Mar. 22, 2022

(54) INCREASING VIRTUAL RESOLUTION OF A CAMERA SENSOR

(71) Applicant: Sony Corporation, Tokyo (JP)

(72) Inventor: Thomas Dawson, Escondido, CA (US)

(73) Assignee: Sony Group Corporation, Tokyo (JP)

( * ) Notice: Subject to any disclaimer, the term of this patent is extended or adjusted under 35 U.S.C. 154(b) by 0 days.

(21) Appl. No.: 16/175,558

(22) Filed: Oct. 30, 2018

(65) Prior Publication Data

US 2020/0137270 A1 Apr. 30, 2020

(51) Int. Cl.
*H04N 5/225* (2006.01)
*H03K 19/14* (2006.01)
*H04N 5/341* (2011.01)

(52) U.S. Cl.
CPC ........... *H04N 5/2253* (2013.01); *H03K 19/14* (2013.01); *H04N 5/341* (2013.01)

(58) Field of Classification Search
CPC .. H04N 5/2253; H04N 5/341; H04N 5/23232; H04N 5/349; H03K 19/14
See application file for complete search history.

(56) References Cited

U.S. PATENT DOCUMENTS

| 5,402,171 A | 3/1995 | Tagami et al. |
| 9,430,814 B2 | 8/2016 | Humfeld |
| 2006/0133786 A1* | 6/2006 | Teramoto ......... H04N 5/232933 396/55 |
| 2010/0045141 A1* | 2/2010 | Pulskamp ............ H01L 41/319 310/328 |
| 2016/0366340 A1* | 12/2016 | Okamoto ........... H04N 5/23293 |

\* cited by examiner

*Primary Examiner* — Nicholas G Giles
(74) *Attorney, Agent, or Firm* — Trellis IP Law Group, PC

(57) ABSTRACT

Implementations generally increase the virtual resolution of a camera sensor. In some implementations, a method includes moving an image sensor in a predetermined pattern, wherein the image sensor includes an array of light collecting elements, and wherein each light collecting element of the sensor array cycles through a plurality of positions in the predetermined pattern. The method further includes capturing a plurality of samples of light at each light collecting element, wherein each light collecting element captures a plurality of the samples in a cycle of movement in the predetermined pattern. The method further includes converting each sample captured at each position into a value. The method further includes generating at least one image from an aggregate of values converted from the samples of light.

18 Claims, 9 Drawing Sheets

900

INCREASING VIRTUAL RESOLUTION OF A CAMERA SENSOR

BACKGROUND

Digital cameras capture and record images using digital technology, which enables users to edit photographs and easily share photographs. Digital cameras include electronic components such as an image sensor to capture incoming light and convert the light into digital values. An image sensor includes an array of photosensitive light collecting or gathering elements that when exposed to light generate a charge pattern corresponding to an optical image. A problem is that a single sample per light collecting element is prone to aliasing artifacts in that a single sample per light collecting element may introduce aliasing artifacts into the image. For example, an image may have a jagged or saw-toothed appearance of curved or diagonal lines in areas of high contrast. This may be solved by increasing the number of physical light collecting elements on the sensor chip. However, increasing the number of physical light collecting elements increases manufacturing costs.

SUMMARY

Implementations generally increase the virtual resolution of a camera sensor. In some implementations, a system includes one or more processors, and includes logic encoded in one or more non-transitory computer-readable storage media for execution by the one or more processors. When executed, the logic is operable to perform operations including moving an image sensor in a predetermined pattern, where the image sensor includes an array of light collecting elements, and where each light collecting element of the sensor array cycles through a plurality of positions in the predetermined pattern; capturing a plurality of samples of light at each light collecting element, where each light collecting element captures a plurality of the samples in a cycle of movement in the predetermined pattern; converting each sample captured at each position into a value; generating at least one image from an aggregate of values converted from the samples of light.

With further regard to the system, in some implementations, piezoelectric actuators reposition the image sensor to enable the light collecting elements to collect light in the plurality of positions. In some implementations, the predetermined pattern is circular. In some implementations, the predetermined pattern is rectangular. In some implementations, each light collecting element captures a sample at each position in the cycle of movement in the predetermined pattern. In some implementations, each value is treated as being a portion of a unique pixel triplet. In some implementations, the logic when executed is further operable to perform operations including computing at least one set of color triplet values based at least in part on combined values from one cycle of movement of each light collecting element in the predetermined pattern.

In some embodiments, a non-transitory computer-readable storage medium with program instructions thereon is provided. When executed by one or more processors, the instructions are operable to perform operations including moving an image sensor in a predetermined pattern, where the image sensor includes an array of light collecting elements used, and where each light collecting element of the sensor array cycles through a plurality of positions in the predetermined pattern; capturing a plurality of samples of light at each light collecting element, where each light collecting element captures a plurality of the samples in a cycle of movement in the predetermined pattern; converting each sample captured at each position into a value; generating at least one image from an aggregate of values converted from the samples of light.

With further regard to the computer-readable storage medium, in some implementations, piezoelectric actuators reposition the image sensor to enable the light collecting elements to collect light in the plurality of positions. In some implementations, the predetermined pattern is circular. In some implementations, the predetermined pattern is rectangular. In some implementations, each light collecting element captures a sample at each position in the cycle of movement in the predetermined pattern. In some implementations, each value is treated as being a portion of a unique pixel triplet. In some implementations, the instructions when executed are further operable to perform operations including computing at least one set of color triplet values based at least in part on combined values from one cycle of movement of each light collecting element in the predetermined pattern.

In some implementations, a method includes moving an image sensor in a predetermined pattern, where the image sensor includes an array of light collecting elements, and where each light collecting element of the sensor array cycles through a plurality of positions in the predetermined pattern. The method further includes capturing a plurality of samples of light at each light collecting element, where each light collecting element of the sensor array captures a plurality of the samples in a cycle of movement in the predetermined pattern. The method further includes converting each sample captured at each position into a value. The method further includes generating at least one image from an aggregate of values converted from the samples of light.

With further regard to the method, in some implementations, piezoelectric actuators reposition the image sensor to enable the light collecting elements to collect light in the plurality of positions. In some implementations, the predetermined pattern is circular. In some implementations, the predetermined pattern is rectangular. In some implementations, each light collecting element captures a sample at each position in the cycle of movement in the predetermined pattern. In some implementations, each value is treated as being a portion of a unique pixel triplet.

A further understanding of the nature and the advantages of particular implementations disclosed herein may be realized by reference of the remaining portions of the specification and the attached drawings.

DETAILED DESCRIPTION

Implementations described herein increase the virtual resolution of a camera image sensor. As described in more detail herein, a camera system increases the virtual resolution of the camera sensor without adding additional light collecting elements to the sensor. This is a virtual increase in resolution because the camera takes a number of subsamples for each light collecting element, which may be combined to create a better quality result. If not combined, the individual virtual light values are passed through to the camera memory to represent an image, which has twice the resolution of the physical camera sensor. Embodiments described herein bypass the increased manufacturing costs while allowing either anti-aliased images or providing images with double the resolution of the physical sensor.

In some implementations, a method includes moving an image sensor in a predetermined pattern, where the image sensor includes an array of light collecting elements, and where each light collecting element of the sensor array cycles through a plurality of positions in the predetermined pattern. The method further includes capturing a plurality of samples of light from each light collecting element, where each light collecting element captures a plurality of the samples in a cycle of movement in the predetermined pattern. The method further includes converting each sample captured at each position into a value. The method further includes generating at least one image from an aggregate of values converted from the samples of light.

Figure 1:
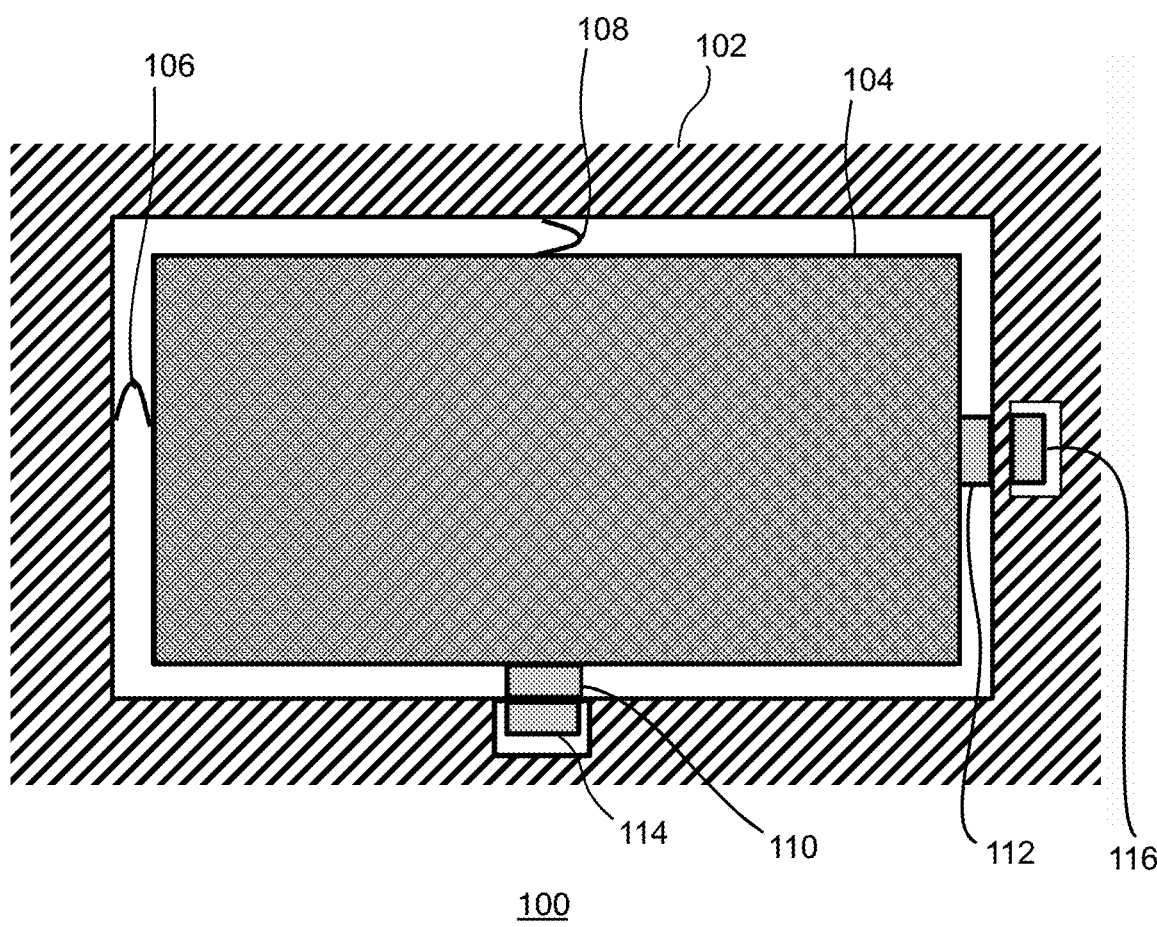
FIG. 1 illustrates a front view of an image sensor, which may be used for implementations described herein.

FIG. 1 illustrates a front view of a camera assembly 100, which may be used for implementations described herein. As shown, camera assembly 100 includes a camera support frame 102 and an image sensor 104 mounted in camera support frame 102 and connected to camera support frame 102 by tunable torsion springs 106 and 108 and piezoelectric actuators 110 and 112. In some embodiments, several more tunable torsion springs may be positioned around image sensor 100 for additional stability and support.

In some embodiments, counter weight actuators 114 and 116 assist with camera stability and smooth sensor movement. Embodiments directed to operations of piezoelectric actuators 110 and 112 and actuated counter weights 114 and 116 are described in more detail herein, for example, in connection with FIG. 3.

In various embodiments, the speed of piezoelectric actuators 110 and 112 enables them to support any camera speed while a stacked structure (e.g., FIG. 3) enables the amplitude of the actuators to match the size of the individual light collecting elements within image sensor 104. In various scenarios, piezoelectric systems such as piezoelectric speakers can handle frequencies well above 20 KHz. A high-speed camera shutter may run at 1 KHz (one thousandth of a second), for example.

In other implementations, image sensor 100 may not have all of the components shown and/or may have other elements including other types of elements instead of, or in addition to, those shown herein.

Figure 2:
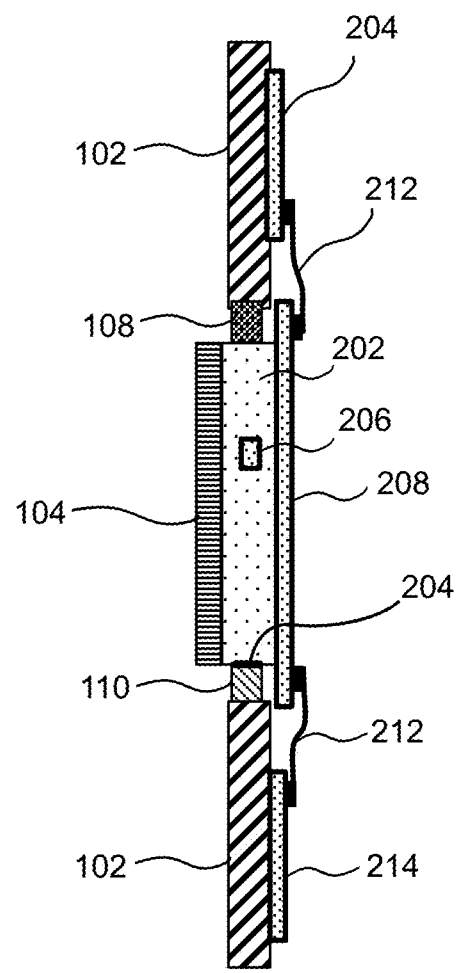
FIG. 2 illustrates a side-view cutaway view of the image sensor of FIG. 1 mounted in a frame, and electronics mounted on the back of the image sensor, according to some implementations.

FIG. 2 illustrates a side-view cutaway view of image sensor 100 of FIG. 1 mounted in a frame, and electronics mounted on the back of the image sensor, according to some implementations. As shown, camera support frame 102 connects to a sensor support module 202 through both the torsion springs such as torsion spring 108 and the piezoelectric actuators such as piezoelectric actuator 110. In various embodiments, sensor support module 202 may include electronics to process values from the light collecting elements in order to produce pixel data from image sensor 104. In other embodiments, pixel data produced within the sensor package itself is processed by the camera electronics module. A connection 204 between sensor support module 202 and the piezoelectric actuator 110 may include the electrical connections needed to control the piezoelectric actuator 110 from sensor support module 202. Sensor support module 202 may include acceleration sensor(s) 206 to fine tune and calibrate the motion of the piezoelectric actuators. Camera sensor electronics 208 collects the data for each individual light collecting element from sensor support module 202. This data may be passed to other processing and storage elements within the camera 210 though flexible cable connections 212 and 214.

In other implementations, image sensor 100 may not have all of the components shown and/or may have other elements including other types of elements instead of, or in addition to, those shown herein.

Figure 3:
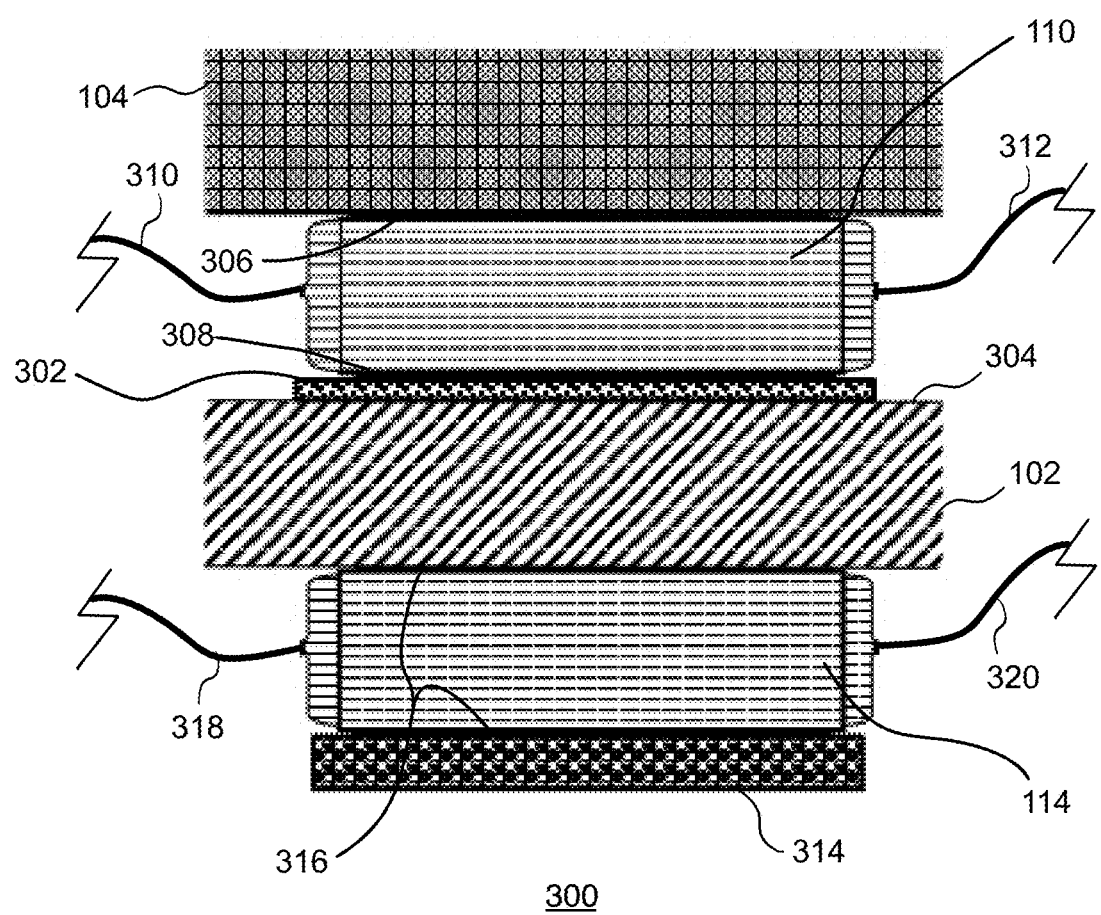
FIG. 3 illustrates a piezoelectric sensor actuator arrangement that includes an actuated counter weight, according to some implementations.

FIG. 3 illustrates a piezoelectric sensor actuator arrangement 300 that includes an actuated counter weight, according to some implementations. An example vertical sensor actuator arrangement configuration is shown. A horizontal sensor actuator arrangement is the same, yet rotated 90 degrees.

Shown is a piezoelectric actuator 110. In various embodiments, a strong adhesive or metal soldering bonds piezoelectric actuator 110 to sensor array 104 and a slider plate 302. Slider plate 302 allows piezoelectric actuator 110 to move in response to motion from the horizontal actuator. A polished smooth surface 304 is substantially friction free and allows piezoelectric actuator 110 to move along the camera support frame 102. In various embodiments, slider plates 306 and 308 may be composed of metal, ceramic or plastic. In various implementations, slider plates 306 and 308 may represent either adhesive or a solder based connection of the piezoelectric stack to the frame and the slider plate. Slider plates 306 and 308 may be rigid and sturdy connections that may be but are not limited to adhesive, soldering, or mechanical. Cabling attachments 310 and 312 connect the actuator to the control electronics of the camera.

Piezoelectric actuator 110 is composed of many layers of piezoelectric elements. As such, piezoelectric actuator 110 may also referred to as a sensor actuator stack. In various embodiments, some number or all of the layers may be activated in a set sequence or at the same time depending on the camera mode settings. In some embodiments, having half of the layers activated may represent a "center' position. In some embodiments, having no layers activated may represent a "bottom" position. In some embodiments, having all of the layers activated may represent a "top" position.

In various embodiments, counter weight actuator 114, also referred to as counter weight actuator stack 114, moves in the opposite direction of piezoelectric actuator 110. For example, when piezoelectric actuator 110 is moving up, counter weight actuator 114 is moving down. When piezoelectric actuator 110 is moving down, counter weight actuator 114 is moving up. A counter weight actuator 314 may be of any rigid material whose weight is enough to counter balance the motion imparted to sensor array 104. A strong adhesive or metal soldering 316 attaches counter weight actuator 114 to camera support frame 102 and the counter weight 314. In some implementations, counter weight actuator 114 (piezoelectric stack) has very little weight (mass) itself and needs the counter weight (additional mass) to balance the motion of the sensor. Cabling attachments 318 and 320 connect counter weight actuator to the control electronics of the camera.

In other implementations, piezoelectric sensor actuator arrangement 300 may not have all of the components shown and/or may have other elements including other types of elements instead of, or in addition to, those shown herein.

Figure 4:
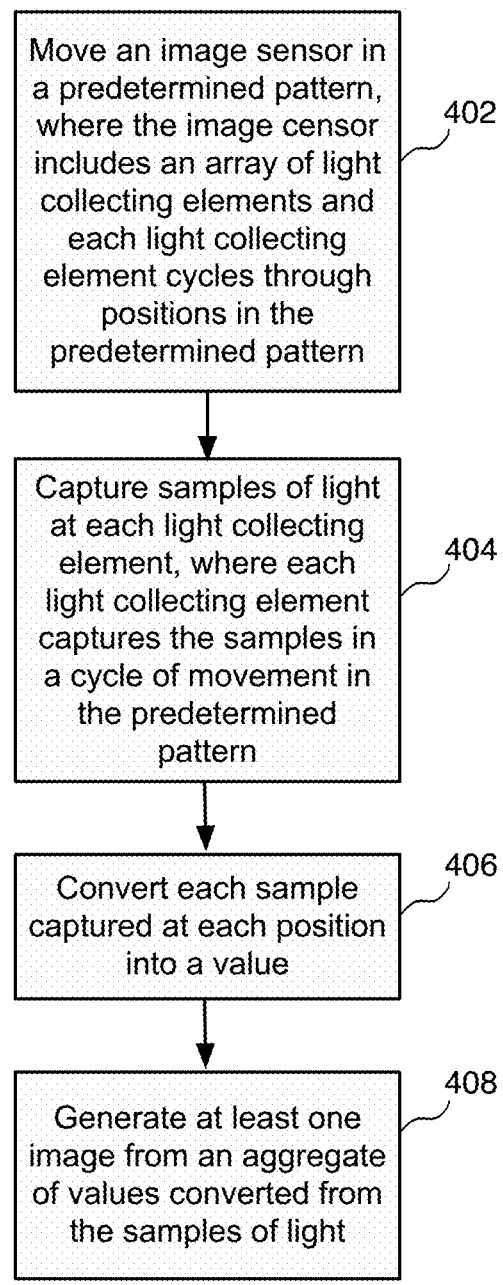
FIG. 4 illustrates an example flow diagram for increasing the virtual resolution of a camera sensor, according to some implementations.

FIG. 4 illustrates an example flow diagram for increasing the virtual resolution of a camera sensor, according to some implementations. Referring to both FIGS. 1 and 4, a method is initiated at block 402, where the system moves an image sensor in a predetermined pattern. As indicated above, the image sensor includes an array of light collecting elements used to produce the values, which constitute the pixels of the image (e.g., pixel triplets). Each light collecting element of the sensor array cycles through a plurality of positions in the predetermined pattern. In various implementations, piezoelectric actuators rapidly reposition the image sensor to enable the light collecting elements to collect light in the plurality of positions. A fast camera shutter speed may be a thousandth of a second, while the piezoelectric actuators are capable of operating at a much faster rate (e.g., 20 KHz, etc.). In some scenarios, the actuator speed may be expected to be in the vicinity of four times the shutter speed. If the shutter is open for one quarter of a second, the actuator has to place the sensor array in four different locations during that quarter second. Typical camera max shutter speed is one thousandth of a second (1 Khz), which means the actuators are running about 4 KHz or less, for example. The actuators move the sensor array to a position for the increased resolution while it collects the light. In some implementations, the predetermined pattern is circular. In some implementations, the predetermined pattern is rectangular, where the light collecting elements move in a step-wise motion. These are example patterns, and particular pattern may vary depending on the particular implementation. For example, the pattern may be a Z pattern, an N pattern, an X pattern, a diamond pattern, etc. Example embodiments direct to the movement of image sensor 104 are described in more detail below.

At block 404, the system captures multiple samples of light at each light collecting element, where each light collecting element captures the samples in a cycle of movement in the predetermined pattern. In various implementations, each light collecting element captures a sample at each position in the cycle of movement in the predetermined pattern (e.g., circular, rectangular, step-wise, etc.). Example embodiments directed to the capturing of samples in predetermined patterns are described in more detail below.

At block 406, the system converts each sample captured at each position into a value. In various embodiments, each value is proportional to the light intensity captured at the corresponding capture position. Different light collecting elements may filter particular wavelengths of light representing different colors (e.g., red, blue, green). The particular color designated for each light collecting element may vary, depending on the particular implementation. In some implementations, system 102 treats each value as being a portion of a unique pixel triplet. In some implementations, system 102 computes at least one set of color triplet values (a portion of a pixel) based at least in part on combined values from one cycle of movement of each light collecting element in the predetermined pattern.

At block 408, the system generates at least one image from an aggregate of values converted from the samples of light. Example embodiments are described in more detail herein.

Embodiments described herein provide various benefits. For example, embodiments double the resolution of the camera image sensor without adding additional physical light collecting elements. Embodiments also improve provide image quality improvements of anti-aliasing to camera sensors in that collecting subsamples for each resulting pixel triplet which suppresses the aliasing and produces a better quality image.

Although the steps, operations, or computations may be presented in a specific order, the order may be changed in particular implementations. Other orderings of the steps are possible, depending on the particular implementation. In some particular implementations, multiple steps shown as sequential in this specification may be performed at the same time. Also, some implementations may not have all of the steps shown and/or may have other steps instead of, or in addition to, those shown herein.

Figure 5A:
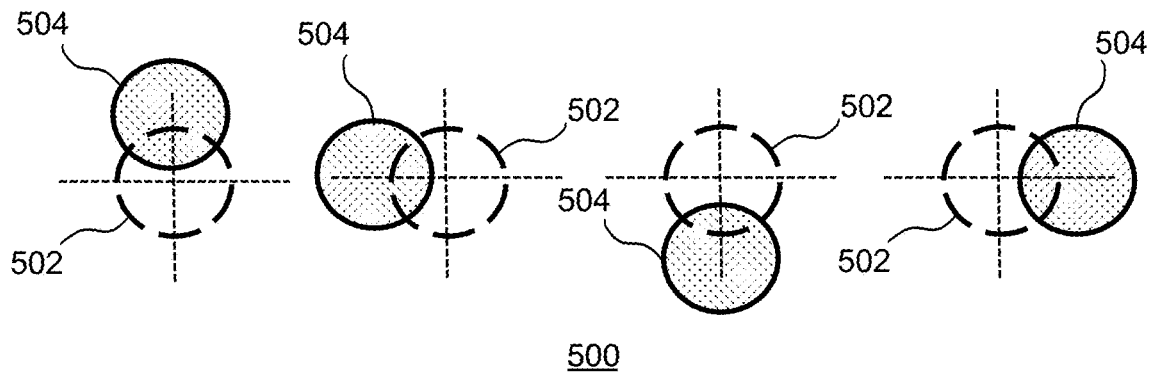
FIG. 5A illustrates a circular light collection pattern that arises from the action of two piezoelectric actuators, which may be used for some implementations described herein.

FIG. 5A illustrates a circular light collection pattern 500 that arises from the action of two piezoelectric actuators, which may be used for some implementations described herein. In various embodiments, each light collecting element of sensor array 104 includes tiny elements that collect light. Each of these elements may collect light at different wavelengths such as red, green, and blue. Other combinations may include collecting magenta, yellow, and cyan, for example. Other configurations are also possible.

Shown is a central position 502 where light would be collected to produce a portion of a pixel triplet 504, or light collecting element 504. Light collecting element 504 represents a single light collecting element of sensor array 104 for illustrative purposes. In this particular example, light collecting element 504 starts at a position that is directly above central position 502. In the next instance, light collecting element 504 is at a position directly to the left of central position 502. In the next instance, light collecting element 504 is at a position directly below central position 502. In the next instance, light collecting element 504 is at a position directly to the right of central position 502.

As shown in this example sequence of movement, in some embodiments, light collecting element 504 transitions from position to position in a continuous circular motion and in a counter-clockwise direction. In some embodiments, light collecting element 504 may transition from position to position in a continuous circular motion and in a clockwise direction. The particular direction of movement will depend on the particular implementation. Also, the light capturing positions of light collecting element 504 are shown such that the center of light collecting element 504 is positioned on the x-axis or y-axis. In some embodiments, the center of light collecting element 504 may be positioned anywhere along the proscribed path.

As indicated herein, light collection pattern 500 arises from the action of the two piezoelectric actuators, such as piezoelectric actuators 110 and 112. Piezoelectric actuators 110 and 112 move sensor array 104 to four different positions as shown, where a sample of light is captured at each position. While embodiments are described herein in the context of four different positions, there may be other numbers of patterns or positions for capturing light samples (e.g., 2, 3, 5, 6, etc.). The number of light-capturing positions may vary depending on the particular implementations.

In this particular example, a sinusoidal pattern is induced by piezoelectric actuators 110 and 112, which results in sensor array 104 moving in a circular motion. While moving in the circular motion, several samples of light are captured (e.g., at each of the 4 positions shown in FIG. 5A).

Figure 5B:
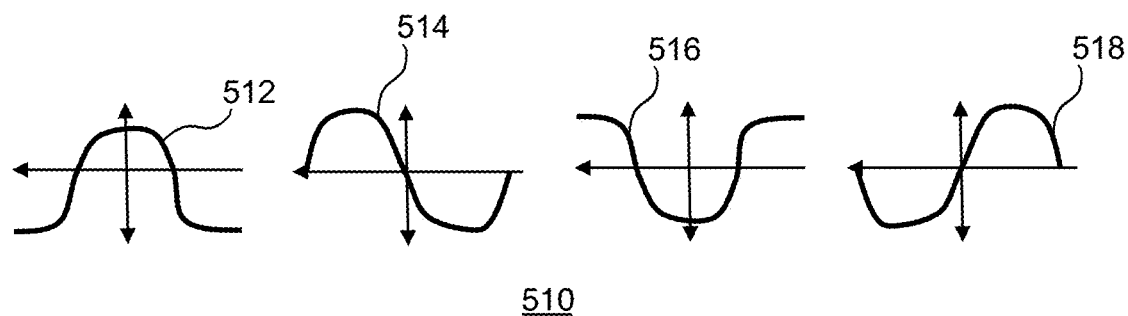
FIG. 5B illustrates a series of graphs showing the action of a piezoelectric actuator causing vertical displacement of the image sensor array over time, which may be used for some implementations described herein.

FIG. 5B illustrates a series of graphs 510 showing the action of a piezoelectric actuator causing vertical displacement of the image sensor array over time, which may be used for some implementations described herein. It provides the horizontal element of the circular motion where several samples of light are captured (e.g., at each of the 4 positions shown in FIG. 5A).

As indicated above, the light collection pattern arises from the action of the two piezoelectric actuators, such as piezoelectric actuators 110 and 112. Shown are graphs 512, 514, 516, and 518, the sequence of which correspond to the sequence shown in FIG. 5A. The series of graphs 512, 514, 516, and 518 show the action of a piezoelectric actuator, such as piezoelectric actuator 110, relative the position of the light collecting elements in sensor array 104 relative to central position 502. The effect of piezoelectric actuator 110 on light collecting element 504 is described in more detail below.

Figure 5C:
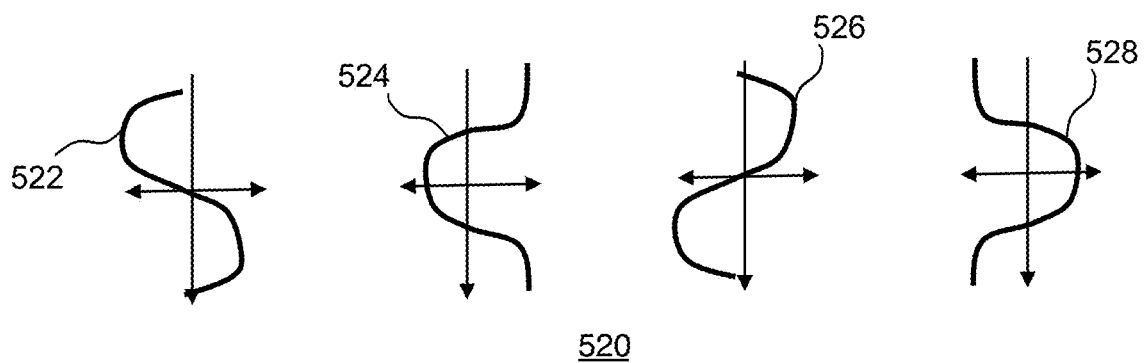
FIG. 5C illustrates a series of graphs showing the action of a piezoelectric actuator causing horizontal displacement of the image sensor array over time, which may be used for some implementations described herein.

FIG. 5C illustrates a series of graphs 520 showing the action of a piezoelectric actuator causing horizontal displacement of the image sensor array over time, which may be used for some implementations described herein. Shown are graphs 522, 524, 526, and 528, the sequence of which corresponds to the sequence shown in FIG. 5A. The series of graphs 522, 524, 526, and 528 show the action of a piezoelectric actuator relative the position of the light collecting elements in sensor array 104 relative to central position 502.

Referring to FIGS. 5A, 5B, and 5C, graph 512 indicates a vertical displacement upward, and graph 522 indicates no horizontal displacement. As a result, light collecting element 504 is positioned directly above central position 502.

Graph 514 indicates no vertical displacement, and graph 524 indicates a horizontal displacement to the left. As a result, light collecting element 504 is positioned directly to the left of central position 502.

Graph 516 indicates a vertical displacement downward, and graph 526 indicates no horizontal displacement. As a result, light collecting element 504 is positioned directly below central position 502.

Graph 514 indicates no vertical displacement, and graph 524 indicates a horizontal displacement to the right. As a result, light collecting element 504 is positioned directly to the right of central position 502.

In some embodiments, there are two modes of operation. In a first mode, each value captured is sent for processing as a portion of a unique pixel triplet, which in effect doubles the horizontal resolution and the vertical resolution of the camera. An advantage is that the resolution of the camera is substantially improved without adding additional light collecting elements to the sensor array. This results in improved image quality while saving manufacturing costs.

In a second mode, the collected values are combined in an image sensor support module in order to create final color values for each corresponding pixel triplet position. Example embodiments are described in more detail herein in connection with FIG. 7, for example.

The following describes a simple step pattern that places a light collecting element in each of four desired positions. In various embodiments, different patterns (e.g., circular patterns, step patterns, X patterns, N patterns, Z patterns, etc.) may be made available. It would also be possible to ensure that the sub-pixel rows and columns of the positions used for light collection do not overlap.

Figure 6A:
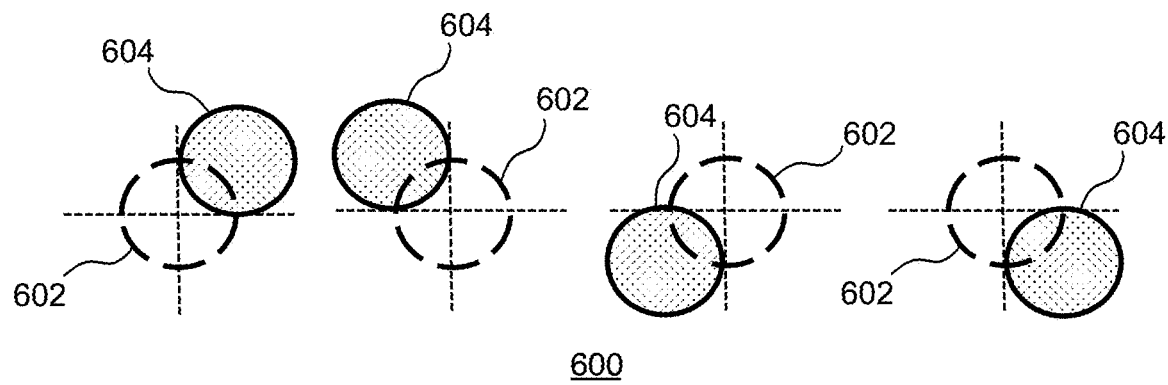
FIG. 6A illustrates a step-wise light collection pattern that arises from the action of two piezoelectric actuators, which may be used for some implementations described herein.

FIG. 6A illustrates a step-wise light collection pattern 600 that arises from the action of two piezoelectric actuators, which may be used for some implementations described herein. Shown is a central position where light would be collected to produce a portion of a pixel triplet 602 of a light collecting element 604. Light collecting element 604 represents a single light collecting element of sensor array 104 for illustrative purposes. In this particular example, light collecting element 604 starts at a position to the upper right of central position 602. In the next instance, light collecting element 604 is at a position to the upper left of central position 602. In the next instance, light collecting element 604 is at a position to the lower left of central position 602. In the next instance, light collecting element 604 is at a position to the lower right of central position 602.

As shown in this example sequence of movement, in some embodiments, light collecting element 604 transitions from position to position in a step-wise motion and in a counter-clockwise direction. In some embodiments, light collecting element 604 may transition from position to position in a step-wise motion and in a clockwise direction. The particular direction of movement will depend on the particular implementation. Also, the light capturing positions of light collecting element 604 are shown such that the center of light collecting element 604 is not positioned on the x-axis or y-axis. In some embodiments, the center of light collecting element 604 may be positioned anywhere along a rectangular path.

As indicated herein, light collection pattern 600 arises from the action of the two piezoelectric actuators, such as piezoelectric actuators 110 and 112. Piezoelectric actuators 110 and 112 move sensor array 104 to four different positions as shown, where a sample of light is captured at each position. While embodiments are described herein in the context of four different positions, there may be other patterns or numbers of positions for capturing light samples (e.g., 2, 3, 5, 6, etc.). The number of light-capturing positions may vary depending on the particular implementations.

In this particular example, a square wave pattern is induced by piezoelectric actuators 110 and 112, which results in sensor array 104 moving in a step-wise motion.

While moving in the step-wise motion, several samples of light are captured (e.g., at each of the 4 positions shown in FIG. 6A).

Figure 6B:
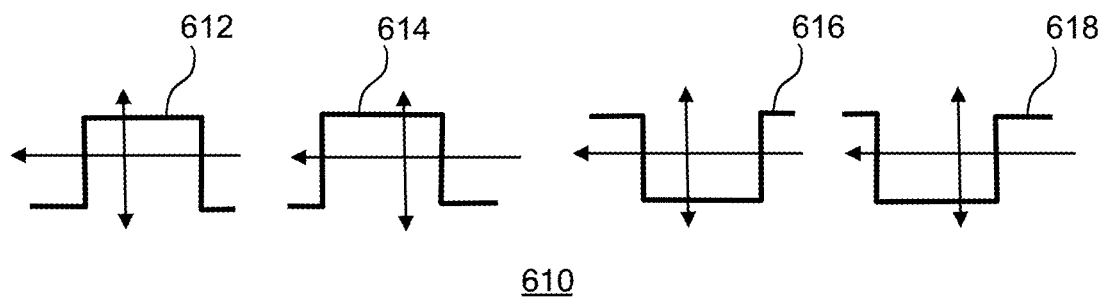
FIG. 6B illustrates a series of graphs showing the action of a piezoelectric actuator causing vertical displacement of the image sensor array over time, which may be used for some implementations described herein.

FIG. 6B illustrates a series of graphs 610 showing the action of a piezoelectric actuator causing vertical displacement of the image sensor array over time, which may be used for some implementations described herein.

As indicated above, the light collection pattern arises from the action of the two piezoelectric actuators, such as piezoelectric actuators 110 and 112. Shown are graphs 612, 614, 616, and 618, the sequence of which correspond to the sequence shown in FIG. 6A. The series of graphs 612, 614, 616, and 618 show the action of a piezoelectric actuator, such as piezoelectric actuator 110, relative the position of the light collecting elements in sensor array 104 relative to central position 602. The effect of piezoelectric actuator 110 on light collecting element 604 is described in more detail below.

Figure 6C:
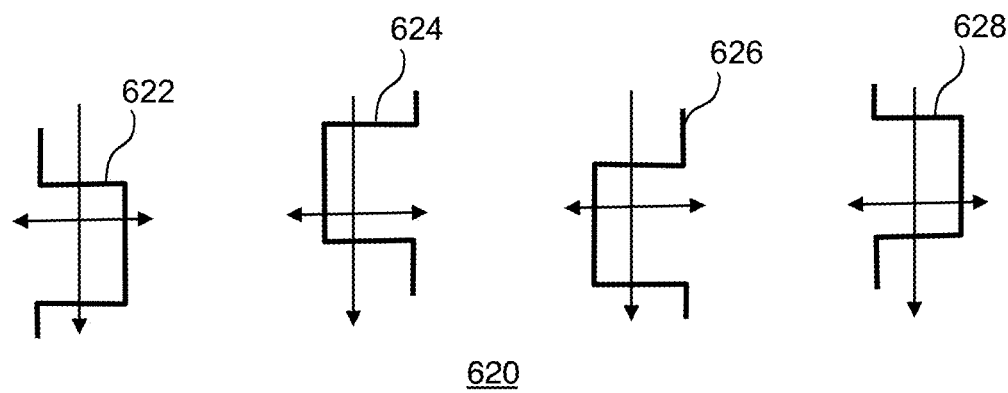
FIG. 6C illustrates a series of graphs showing the action of a piezoelectric actuator causing horizontal displacement of the image sensor array over time, which may be used for some implementations described herein.

FIG. 6C illustrates a series of graphs 620 showing the action of a piezoelectric actuator causing horizontal displacement of the image sensor array over time, which may be used for some implementations described herein. Shown are graphs 622, 624, 626, and 628, the sequence of which correspond to the sequence shown in FIG. 6A. The series of graphs 622, 624, 626, and 628 show the action of a piezoelectric actuator relative the position of the light collecting elements in sensor array 104 relative to central position 602.

Referring to FIGS. 6A, 6B, and 6C, graph 612 indicates a vertical displacement upward, and graph 622 indicates a horizontal displacement to the right. As a result, light collecting element 604 is positioned to the upper right of central position 602.

Graph 614 indicates a vertical displacement upward, and graph 624 indicates a horizontal displacement to the left. As a result, light collecting element 604 is positioned to the upper left of central position 602.

Graph 616 indicates a vertical displacement downward, and graph 626 indicates a horizontal displacement to the left. As a result, light collecting element 604 is positioned to the lower left of central position 602.

Graph 614 indicates a vertical displacement downward, and graph 624 indicates a horizontal displacement to the right. As a result, light collecting element 604 is positioned to the lower right of central position 602.

Figure 7:
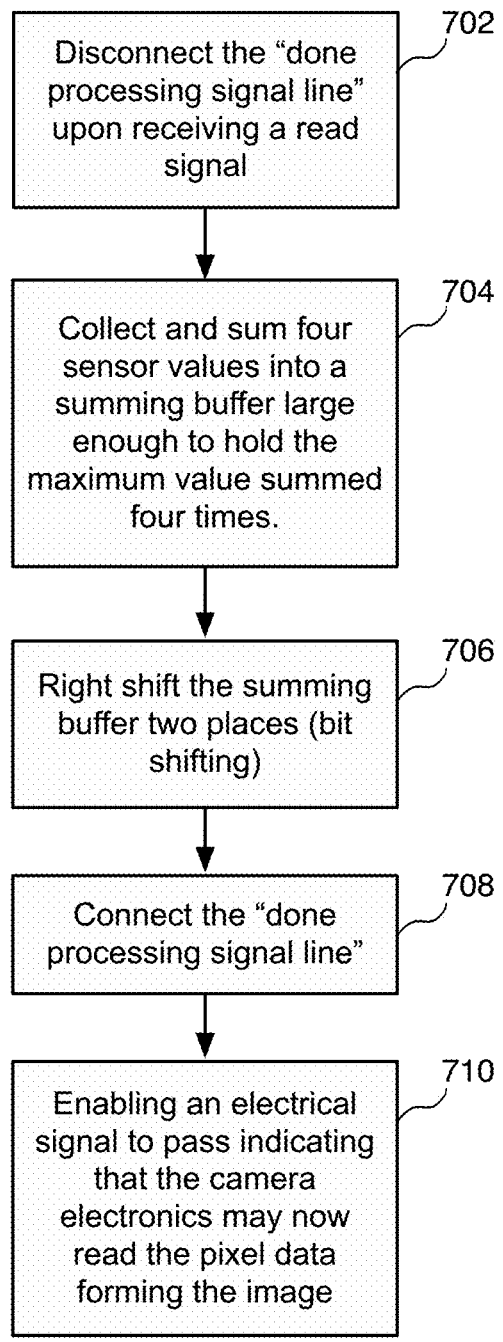
FIG. 7 illustrates an example flow diagram for combining sub-samples into a final output for inclusion in a pixel triplet, according to some implementations.

FIG. 7 illustrates an example flow diagram for combining sub-samples taken from the four positions into a final output to create a portion of a pixel triplet, according to some implementations. This flow diagram is directed to the second mode described above, where the system combines the sub-samples into a final output for a portion of a given pixel triplet that has four times as much raw data as it would have otherwise without the movement. In various embodiments, this process occurs in parallel for all light collecting elements. In various embodiments, the steps of the flow diagram may occur within the sensor array itself or within the sensor support electronics. In some embodiments, the camera may wait until the sensor array has begun to rotate for one or more cycles to ensure steady operation and consistent light collection.

In various implementations, a method is initiated at block 702, where the system disconnects a "done processing signal line" upon receiving a read signal. This allows for some preprocessing to occur before the processor of the camera accesses the data for generating an image.

At block 704, the system collects and sums four sensor values into a summing buffer large enough to hold the maximum value summed four times. This is performed while the sensor is in motion. In various embodiments, each light collecting element collects data for a particular color of a pixel triplet. The system collects subsample values from each of four positions and then sums those values. In various implementations, the buffer size is two bits larger than the size of the data capture value. Different cameras can capture different bit sizes per light collecting element. For example, 8 bits can represent up to 256 different values. If the camera captures 12 bits from the light collecting element, the buffer would need to be 14 bits. Each bit represents twice the amount of data as the one to its right. Only need two extra bits is needed to cover adding up the four values.

At block 706, the system right shifts the summing buffer two places (bit shifting). This is performed after summing the values. Shifting right two places is equivalent to dividing by four.

At block 708, the portion processing that value connects the "done processing signal line." This is performed after bit shifting. Connecting the "done processing signal line" enables the data from a particular light collecting element to be read by the processor of the camera.

At block 710, the system enables an electrical signal may pass indicating the camera electronics may now read the pixel data forming the image. In various embodiments, the "done processing signal lines" are connected in series. As such, the camera electronics (e.g., camera processor) when all pixel elements have connected their portion of the "done processing signal line."

In some implementations, the mode where the four values are passed through without being combined increases the resolution. The mode where the four values are combined to create a single value is for anti-aliasing. The four sub-sampled values combined create a portion of a pixel triplet that includes information from several points and not a single sample. By merging several samples, implementations avoid the jagged edges associated with images where there is a single sample taken for each portion of each pixel triplet.

Although the steps, operations, or computations may be presented in a specific order, the order may be changed in particular implementations. Other orderings of the steps are possible, depending on the particular implementation. In some particular implementations, multiple steps shown as sequential in this specification may be performed at the same time. Also, some implementations may not have all of the steps shown and/or may have other steps instead of, or in addition to, those shown herein.

Figure 8:
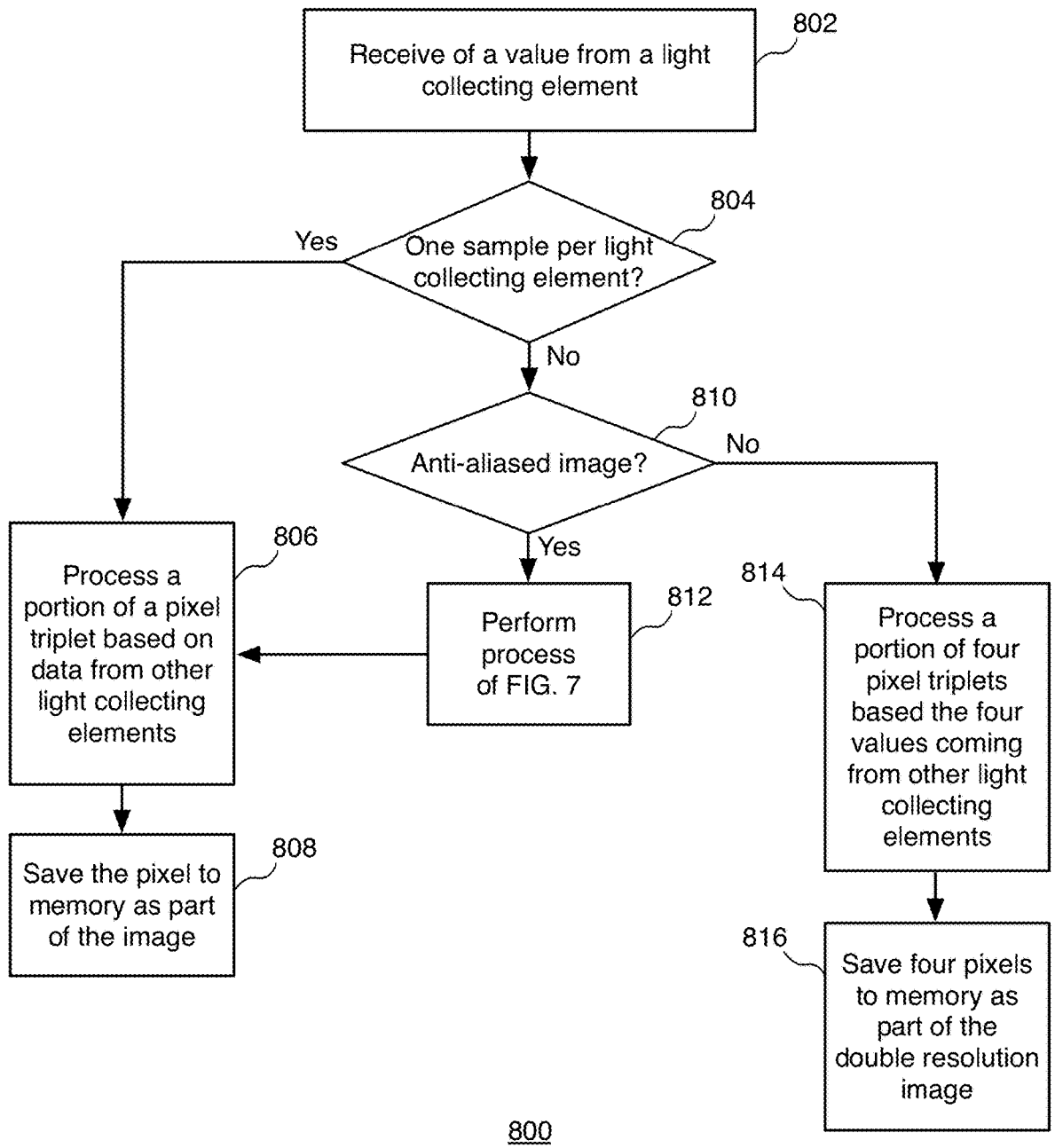
FIG. 8 illustrates an example flow diagram directed to overall processing of camera sensor operations, according to some implementations.

FIG. 8 illustrates an example flow diagram directed to overall processing of camera sensor operations, according to some implementations. In some implementations, a method is initiated at block 802, where the system receives a value from a light collecting element.

At block 804, the system determines if there is one sample per light collecting element.

At block 806, if the system determines that there is one sample per light collecting element, the system processes a portion of a pixel triplet based on data from other light collecting elements.

At block 808, the system saves the pixel to memory as part of the image.

At block 810, if the system determines that there is not one sample per light collecting element (block 804), the system determines if there is an anti-aliased image.

At block 812, if system determines that there is an anti-aliased image, the system performs the process of FIG. 7.

At block 814, if the system determines that there is not an anti-aliased image, the system processes a portion of four pixel triplets based the four values coming from other light collecting elements.

At block 816, the system saves four pixels to memory as part of the double resolution image.

Although the steps, operations, or computations may be presented in a specific order, the order may be changed in particular implementations. Other orderings of the steps are possible, depending on the particular implementation. In some particular implementations, multiple steps shown as sequential in this specification may be performed at the same time. Also, some implementations may not have all of the steps shown and/or may have other steps instead of, or in addition to, those shown herein.

Figure 9:
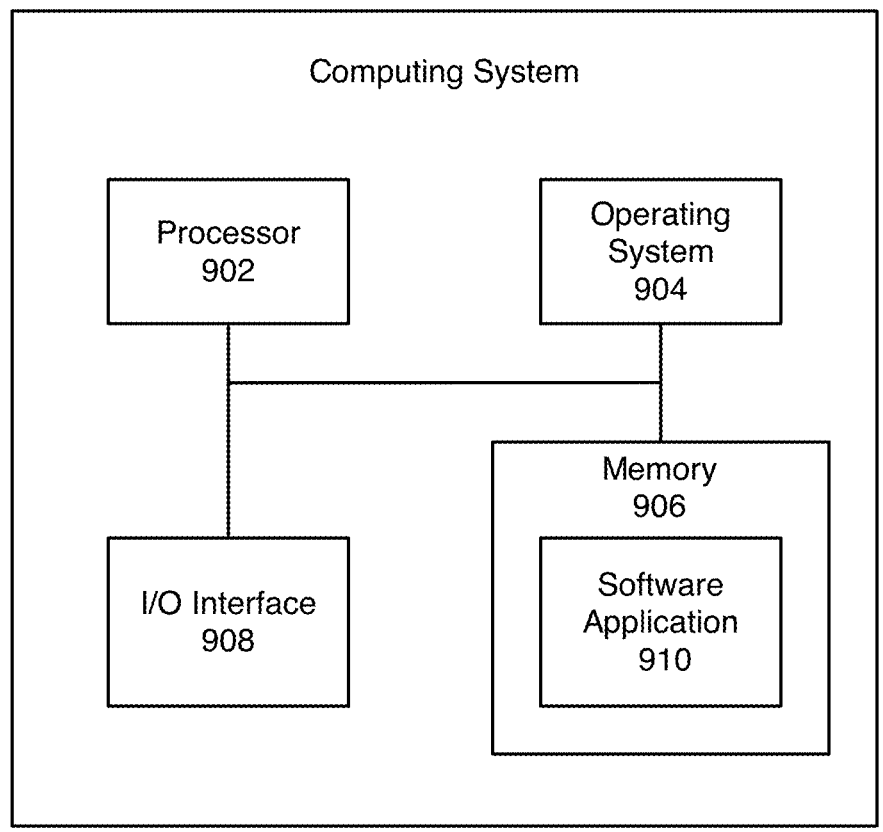
FIG. 9 illustrates a block diagram of an example computing system, which may be used for some implementations described herein.

FIG. 9 illustrates a block diagram of an example computing system 900, which may be used for some implementations described herein. In some implementations, computing system 900 may include a processor 902, an operating system 904, a memory 906, and an input/output (I/O) interface 908. In various implementations, processor 902 may be used to implement various functions and features described herein, as well as to perform the method implementations described herein. While processor 902 is described as performing implementations described herein, any suitable component or combination of components of computing system 900 or any suitable processor or processors associated with computing system 900 or any suitable system may perform the steps described. Implementations described herein may be carried out on a user device, on a server, or a combination of both.

Computing system 900 also includes a software application 910, which may be stored on memory 906 or on any other suitable storage location or computer-readable medium. Software application 910 provides instructions that enable processor 902 to perform the implementations described herein and other functions. Software application may also include an engine such as a network engine for performing various functions associated with one or more networks and network communications. The components of computing system 900 may be implemented by one or more processors or any combination of hardware devices, as well as any combination of hardware, software, firmware, etc.

For ease of illustration, FIG. 9 shows one block for each of processor 902, operating system 904, memory 906, I/O interface 908, and software application 910. These blocks 902, 904, 906, 908, and 910 may represent multiple processors, operating systems, memories, I/O interfaces, and software applications. In various implementations, computing system 900 may not have all of the components shown and/or may have other elements including other types of components instead of, or in addition to, those shown herein.

Although the description has been described with respect to particular embodiments thereof, these particular embodiments are merely illustrative, and not restrictive. Concepts illustrated in the examples may be applied to other examples and implementations.

In various implementations, software is encoded in one or more non-transitory computer-readable media for execution by one or more processors. The software when executed by one or more processors is operable to perform the implementations described herein and other functions.

Any suitable programming language can be used to implement the routines of particular embodiments including C, C++, Java, assembly language, etc. Different programming techniques can be employed such as procedural or object oriented. The routines can execute on a single processing device or multiple processors. Although the steps, operations, or computations may be presented in a specific order, this order may be changed in different particular embodiments. In some particular embodiments, multiple steps shown as sequential in this specification can be performed at the same time.

Particular embodiments may be implemented in a non-transitory computer-readable storage medium (also referred to as a machine-readable storage medium) for use by or in connection with the instruction execution system, apparatus, or device. Particular embodiments can be implemented in the form of control logic in software or hardware or a combination of both. The control logic when executed by one or more processors is operable to perform the implementations described herein and other functions. For example, a tangible medium such as a hardware storage device can be used to store the control logic, which can include executable instructions.

Particular embodiments may be implemented by using a programmable general purpose digital computer, and/or by using application specific integrated circuits, programmable logic devices, field programmable gate arrays, optical, chemical, biological, quantum or nanoengineered systems, components and mechanisms. In general, the functions of particular embodiments can be achieved by any means as is known in the art. Distributed, networked systems, components, and/or circuits can be used. Communication, or transfer, of data may be wired, wireless, or by any other means.

A "processor" may include any suitable hardware and/or software system, mechanism, or component that processes data, signals or other information. A processor may include a system with a general-purpose central processing unit, multiple processing units, dedicated circuitry for achieving functionality, or other systems. Processing need not be limited to a geographic location, or have temporal limitations. For example, a processor may perform its functions in "real-time," "offline," in a "batch mode," etc. Portions of processing may be performed at different times and at different locations, by different (or the same) processing systems. A computer may be any processor in communication with a memory. The memory may be any suitable data storage, memory and/or non-transitory computer-readable storage medium, including electronic storage devices such as random-access memory (RAM), read-only memory (ROM), magnetic storage device (hard disk drive or the like), flash, optical storage device (CD, DVD or the like), magnetic or optical disk, or other tangible media suitable for storing instructions (e.g., program or software instructions) for execution by the processor. For example, a tangible medium such as a hardware storage device can be used to store the control logic, which can include executable instructions. The instructions can also be contained in, and provided as, an electronic signal, for example in the form of software as a service (SaaS) delivered from a server (e.g., a distributed system and/or a cloud computing system).

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope to implement a program or code that can be stored in a machine-readable medium to permit a computer to perform any of the methods described above.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

What is claimed is:

1. A system comprising:
one or more processors; and
logic encoded in one or more non-transitory computer-readable storage media for execution by the one or more processors and when executed operable to perform operations comprising:
moving an image sensor in a predetermined pattern, wherein the moving of the image sensor in the predetermined pattern is based on at least two stacked piezoelectric actuators, wherein each piezoelectric actuator of the at least two stacked piezoelectric actuators comprise a plurality of piezoelectric layers, wherein at least one portion of the piezoelectric layers of one or more of the stacked piezoelectric actuators are activated to move the image sensor in the predetermined pattern, wherein the image sensor includes an array of light collecting elements, and wherein each light collecting element of the array cycles through a plurality of positions in the predetermined pattern based on actuation of the at least one portion of the layers of the one or more stacked piezoelectric actuators;
smoothening movement of the image sensor based on at least two counter weight actuators, wherein each counter weight actuator of the at least two counter weight actuators corresponds to one of the at least two stacked piezoelectric actuators, and wherein each counter weight actuator moves in a opposite direction to its corresponding stacked piezoelectric actuator;
capturing a plurality of samples of light at each light collecting element, wherein each light collecting element captures the plurality of samples in a continuous cycle of movement in the predetermined pattern;
converting each sample captured at each position into a set of color triplet values based at least in part on one cycle of movement of each light collecting element in the predetermined pattern; and
generating at least one image from an aggregate of values converted from the plurality of samples of light.

2. The system of claim 1, wherein the at least two stacked piezoelectric actuators reposition the image sensor to enable the light collecting elements to collect light in the plurality of positions, wherein each value converted from a sample is proportional to a light intensity captured at a corresponding capture position.

3. The system of claim 1, wherein the predetermined pattern is based on movement of the image sensor in a continuous circular movement.

4. The system of claim 1, wherein each counter weight actuator and each stacked piezoelectric is coupled to opposites sides of a support frame that supports the image sensor.

5. The system of claim 1, wherein each light collecting element captures a sample at each position in the cycle of movement in the predetermined pattern.

6. The system of claim 1, wherein each value is treated as being a portion of a unique pixel triplet.

7. A non-transitory computer-readable storage medium with program instructions stored thereon, the program instructions when executed by one or more processors are operable to perform operations comprising:
moving an image sensor in a predetermined pattern, wherein the moving of the image sensor in the predetermined pattern is based on at least two stacked piezoelectric actuators, wherein each piezoelectric actuator of the at least two stacked piezoelectric actuators comprise a plurality of piezoelectric layers, wherein at least one portion of the piezoelectric layers of one or more of the stacked piezoelectric actuators are activated to move the image sensor in the predetermined pattern, wherein the image sensor includes an array of light collecting elements, and wherein each light collecting element of the array cycles through a plurality of positions in the predetermined pattern based on actuation of the at least one portion of the layers of the one or more stacked piezoelectric actuators;
smoothening movement of the image sensor based on at least two counter weight actuators, wherein each counter weight actuator of the at least two counter weight actuators corresponds to one of the at least two stacked piezoelectric actuators, and wherein each counter weight actuator moves in a opposite direction to its corresponding stacked piezoelectric actuator;
capturing a plurality of samples of light at each light collecting element, wherein each light collecting element captures the plurality of samples in a continuous cycle of movement in the predetermined pattern;
converting each sample captured at each position into a set of color triplet values based at least in part on one cycle of movement of each light collecting element in the predetermined pattern; and
generating at least one image from an aggregate of values converted from the plurality of samples of light.

8. The computer-readable storage medium of claim 7, wherein the at least two stacked piezoelectric actuators reposition the image sensor to enable the light collecting elements to collect light in the plurality of positions, wherein each value converted from a sample is proportional to a light intensity captured at a corresponding capture position.

9. The computer-readable storage medium of claim 7, wherein the predetermined pattern is circular.

10. The computer-readable storage medium of claim 7, wherein the predetermined pattern is rectangular.

11. The computer-readable storage medium of claim 7, wherein each light collecting element captures a sample at each position in the cycle of movement in the predetermined pattern.

12. The computer-readable storage medium of claim 7, wherein each value is treated as being a portion of a unique pixel triplet.

13. A computer-implemented method comprising:
moving an image sensor in a predetermined pattern, wherein the moving of the image sensor in the predetermined pattern is based on at least two stacked piezoelectric actuators, wherein each piezoelectric actuator of the at least two stacked piezoelectric actuators comprise a plurality of piezoelectric layers, wherein at least one portion of the piezoelectric layers of one or more of the stacked piezoelectric actuators are activated to move the image sensor in the predetermined pattern, wherein the image sensor includes an array of light collecting elements, and wherein each light collecting element of the array cycles through a plurality of positions in the predetermined pattern based on actuation of the at least one portion of the layers of the one or more stacked piezoelectric actuators;

smoothening movement of the image sensor based on at least two counter weight actuators, wherein each counter weight actuator of the at least two counter weight actuators corresponds to one of the at least two stacked piezoelectric actuators, and wherein each counter weight actuator moves in a opposite direction to its corresponding stacked piezoelectric actuator;

capturing a plurality of samples of light at each light collecting element, wherein each light collecting element captures the plurality of samples in a continuous cycle of movement in the predetermined pattern;

converting each sample captured at each position into a set of color triplet values based at least in part on one cycle of movement of each light collecting element in the predetermined pattern; and generating at least one image from an aggregate of values converted from the plurality of samples of light.

14. The method of claim 13, wherein the at least two stacked piezoelectric actuators reposition the image sensor to enable the light collecting elements to collect light in the plurality of positions, wherein each value converted from a sample is proportional to a light intensity captured at a corresponding capture position.

15. The method of claim 13, wherein the predetermined pattern is circular.

16. The method of claim 13, wherein the predetermined pattern is rectangular.

17. The method of claim 13, wherein each light collecting element captures a sample at each position in the cycle of movement in the predetermined pattern.

18. The method of claim 13, wherein each value is treated as being a portion of a unique pixel triplet.

* * * * *